United States Patent [19]

Ko et al.

[11] Patent Number: 4,500,834
[45] Date of Patent: Feb. 19, 1985

[54] APPARATUS AND METHOD FOR LOCATING THE POSITION OF A FAULT OCCURRING IN AN ELECTRIC POWER TRANSMISSION SYSTEM WITH RESPECT TO A MONITORING POINT

[75] Inventors: Yu M. Ko, Hung Hom, Hong Kong; Keith Cornick, Manchester, England

[73] Assignee: The General Electric Company, p.l.c., England

[21] Appl. No.: 362,625

[22] Filed: Mar. 29, 1982

[30] Foreign Application Priority Data

Apr. 3, 1981 [GB] United Kingdom ............... 8110508

[51] Int. Cl.³ .......................... G01R 31/08; H04B 3/46
[52] U.S. Cl. ............................... 324/52; 179/175.3 F; 324/58.5 B
[58] Field of Search ............... 179/175.3 F; 324/58 B, 324/58.5 B, 52

[56] References Cited

U.S. PATENT DOCUMENTS 2,628,267 2/1953 Stringfield ........................... 324/52

FOREIGN PATENT DOCUMENTS 0006005 12/1979 European Pat. Off. .
2523005 4/1977 Fed. Rep. of Germany .
1460347 1/1977 United Kingdom .
1520294 8/1978 United Kingdom .
1520629 8/1978 United Kingdom .

OTHER PUBLICATIONS

Szeredi: "Testing Telecommunication Cables for Damage", IBM Bulletin-vol. 21, No. 9-Feb. 1979-pp. 3665-3666.

Primary Examiner—Stanley T. Krawczewicz
Assistant Examiner—Jose M. Solis
Attorney, Agent, or Firm—Kirschstein, Kirschstein, Ottinger & Israel

[57] ABSTRACT

A method and apparatus for locating the position of a fault occurring in an electric power transmission system wherein an indication of the position of the fault with respect to a monitoring point is obtained from the time taken for a transient component of fault signal to travel from the monitoring point to the fault and back to the monitoring point after reflection at the fault.

18 Claims, 7 Drawing Figures

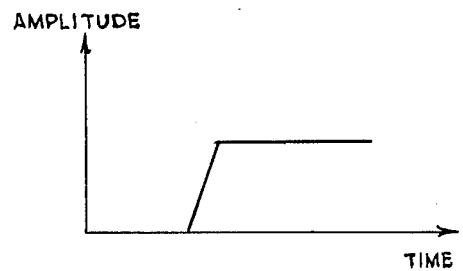
FIG.3.A.
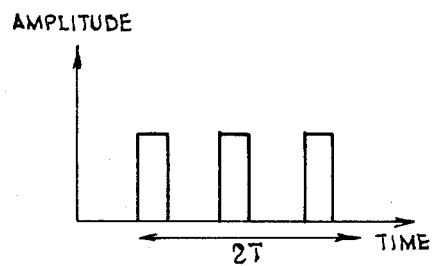 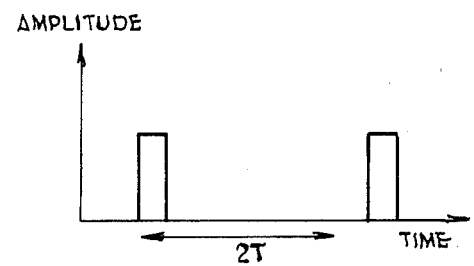
FIG.3B.    FIG.3C.
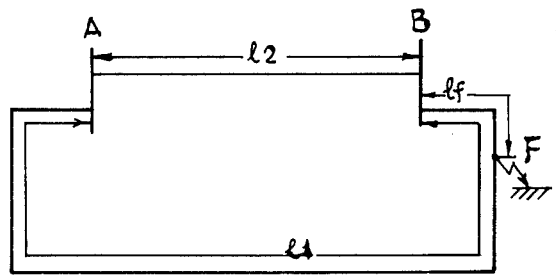
FIG.5.

APPARATUS AND METHOD FOR LOCATING THE POSITION OF A FAULT OCCURRING IN AN ELECTRIC POWER TRANSMISSION SYSTEM WITH RESPECT TO A MONITORING POINT

BACKGROUND OF THE INVENTION

1. Field of the Invention

This invention relates to methods and apparatus for use in protecting electric power transmission systems against faults.

2. Description Of the Prior Art

It has previously been proposed to detect the occurrence of a fault in a power transmission system and identify the type of fault which has occurred (i.e. phase-to-ground or phase-to-phase etc.) using fault signals. By a fault signal is meant a signal which arises as a consequence of a fault, that is, a signal representing the difference between post-fault and pre-fault values of any particular quantity.

SUMMARY OF THE INVENTION

1. Aims of the Invention

It is an object of the present invention to provide a method and apparatus for obtaining an indication of the position of a fault occurring in an electric power transmission system using fault signals.

2. Brief Description of the Invention

According to the present invention there is provided a method of locating the position of a fault occurring in an electric power transmission system with respect to a monitoring point wherein an indication of the position of the fault is obtained from the time taken for a transient component of a fault signal to travel from said monitoring point to the fault and back to said monitoring point after reflection at the fault.

Said time taken may commence when said transient component is reflected at said monitoring point.

Alternatively, said time taken may commence when said transient component passes the monitoring point after reflection at a point on the side of the monitoring point remote from the fault.

In one particular method in accordance with the invention said time taken is compared with the time that a transient signal would take to travel from said monitoring point to the end of a zone to be protected by protective relay equipment associated with the apparatus and back to the monitoring point, thereby to determine whether the fault lies within the zone to be protected by said equipment;

Apparatus for locating the position of a fault occurring in an electric power transmission system with respect to a monitoring point using the method in accordance with the invention is also provided by the invention.

One such apparatus comprises: signal generating means for producing an output signal in response to the passage of a transient component of a fault signal away from said monitoring point in a given direction; and output means responsive to the time between successive outputs from said signal generating means to provide an output indicative of the position of the fault.

Another such apparatus comprises: first signal generating means for producing an output signal in response to the passage of a transient component of a fault signal past said monitoring point in a direction towards the fault; second signal generating means for producing an output signal in response to the passage of a transient component of a fault signal past said monitoring point in a direction away from the fault; and output means responsive to the time between an output of the first signal generating means and the next occurrence of an output from the second signal generating means.

BRIEF DESCRIPTION OF THE DRAWINGS

The method provided by the invention will now be further explained, and one example of an apparatus operating in accordance with the method of the invention will be described, with reference to the accompanying drawings in which:

FIGS. 1, 2 3A, 3B and 3C are diagrams illustrating the principle of the method according to the invention;

FIG. 5 illustrates a circumstance requiring modification of the apparatus of FIG. 4.

DESCRIPTION OF THE PREFERRED EMBODIMENT

Figure 1:
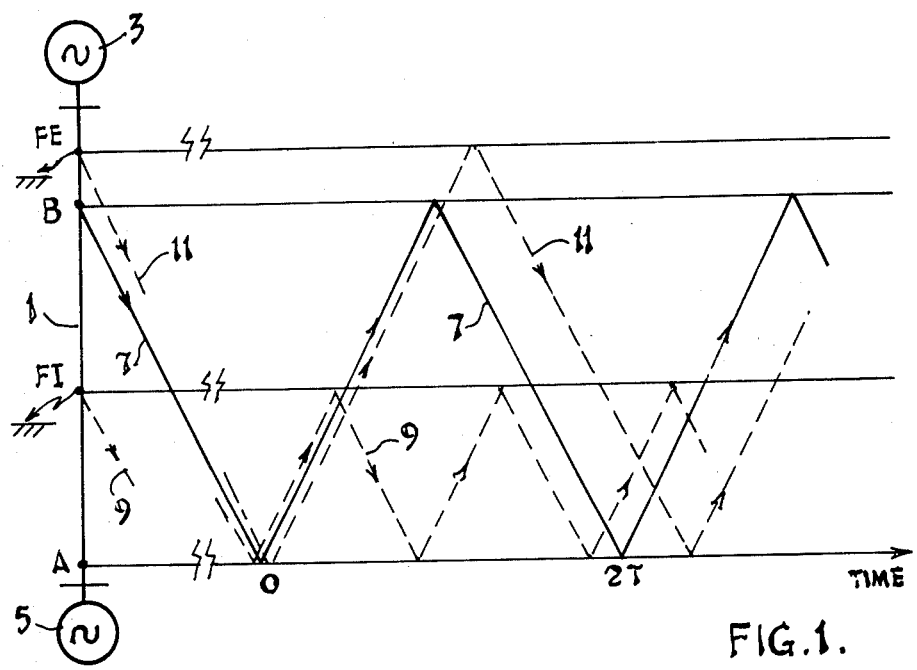

FIG. 1 shows a power transmission line 1 with emf sources 3 and 5 at opposite ends.

At a position A on the line there is located a protective relay equipment (not shown) arranged to protect the zone of the line between points A and B.

The occurrence of a ground fault on an electric power transmission line is equivalent to suddenly superimposing a voltage at the fault point which is equal and opposite to the pre-fault voltage at the fault point. Hence, when a ground fault occurs on the line 1, a rapid transient fault signal is produced at the fault point which propagates along the line, the transient signal being the wavefront of the fault signal which arises in consequence of the fault. When the transient signal reaches point A it will be partially reflected back towards the fault point. On returning to the fault point the transient signal will again be reflected and return to the monitoring point A.

As indicated by full line 7 in FIG. 1, taking zero time to be the time when the transient signal first reaches point A, and T to be the time the transient signal takes to travel from point A to point B or vice versa, then for a fault at point B the time which elapses between the first and second appearances of a transient signal at the point A is 2T.

For a fault at a point such as FI within the protected zone AB, the time which elapses between the first and second appearances of a transient signal at the point A will be less than 2T as indicated by dotted line 9 in FIG. 1.

Similarly, for a fault at a point such as FE beyond the protected zone AB, the elapsed time will be greater than 2T, as indicated by chain-dotted line 11 in FIG. 1.

Thus, by determining whether the time which elapses between the first and second appearances of a transient signal at the point A is greater or less than 2T, it may be determined whether or not the fault is within the protected zone AB. Moreover, by measurement of the elapsed time the distance of the fault from the point A may be determined.

In a practical system the reflection coefficient at the monitoring point A may be too low to allow location as described above. This difficulty can be overcome by making use of reflection occurring at a point on the side of point A, away from point B, as will now be explained.

Figure 2:
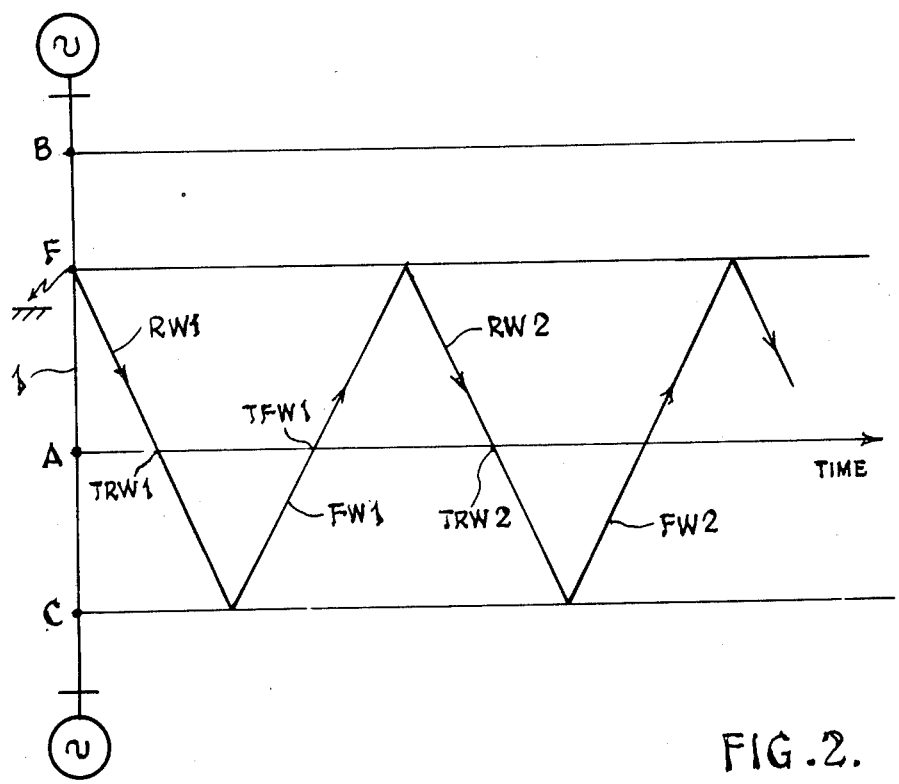

Referring to FIG. 2, when a fault occurs at a point F on line 1, a transient signal, indicated by line RW1, travels from the fault point through point A at a time TRW1 to a point C where it is reflected. The resulting reflected signal, indicated by line FW1, travels through point A at a time TFW1 and is reflected at fault point F. The resultant reflected signal, indicated by line RW2, travels through point A at a time TRW2 giving rise to a further signal by reflection at point C as indicated by line FW2, and so on. As can be seen from FIG. 2, the time which elapses between the appearance at point A of signals FW1 and RW2, i.e. TRW2−TFW1, will be greater than or less than 2T according to whether the fault point is beyond or inside the protected zone AB.

The passage of transient fault signals through the point A can conveniently be detected by differentiating fault signals at the point A. Typically the fault signal wavefront will be essentially of step form, as indicated in FIG. 3A, and the resulting differentiated signals will therefore be of pulse form, as indicated in FIGS. 3B and 3C, FIG. 3B showing the pulses obtained for a fault within the protected zone, and FIG. 3C the pulses obtained for a fault beyond the protected zone.

One particular apparatus operating in accordance with the method of the present invention will now be described with reference to FIG. 4.

Figure 4:
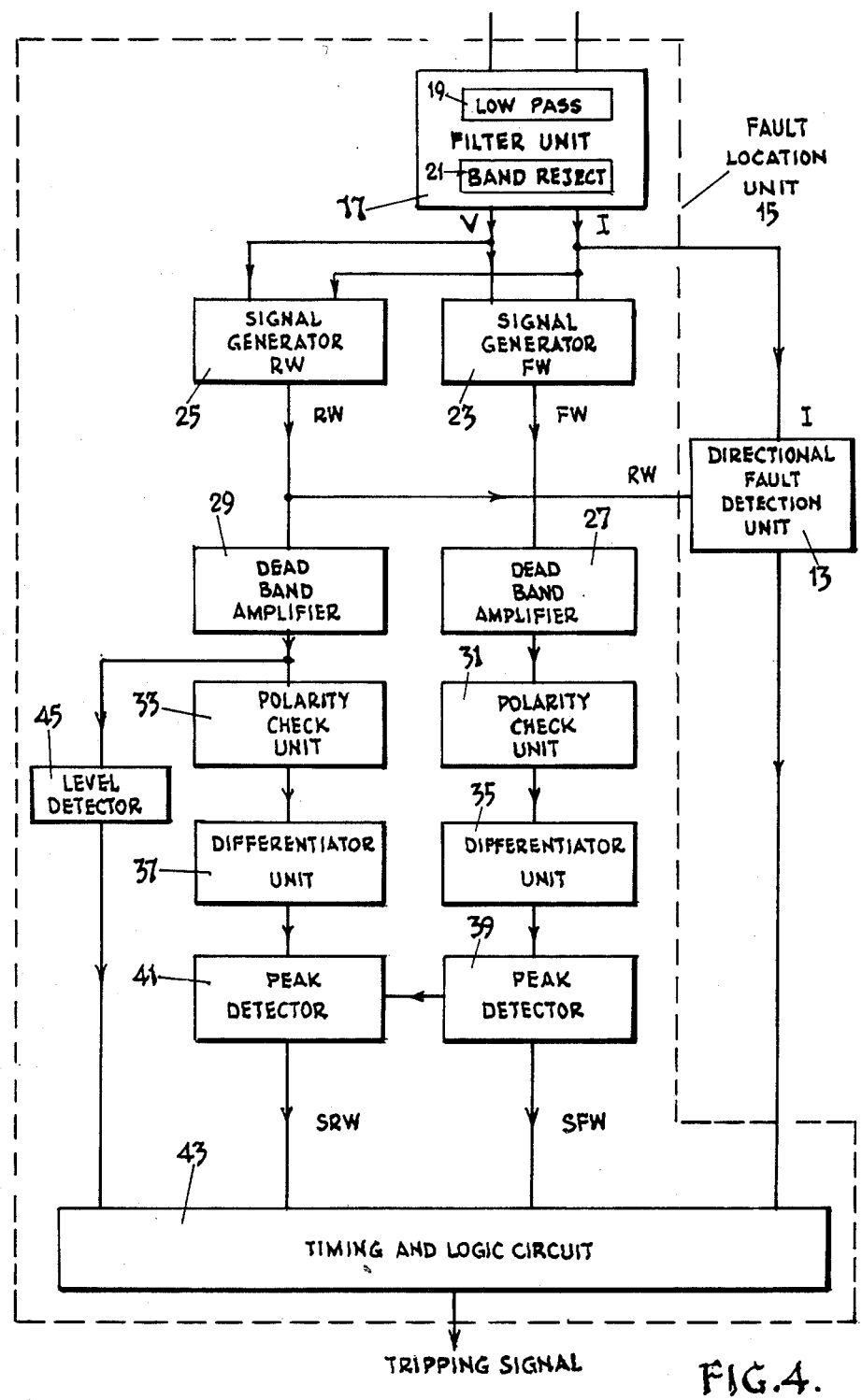
FIG. 4 is a block schematic diagram of the apparatus.

The apparatus comprises a directional fault detection unit 13 and a fault location unit 15 for each phase of the associated transmission system, the units for one phase only being shown in FIG. 4.

Each unit 15 includes a filter unit 17 to which are fed signals representing the voltage and current in the associated phase. Each filter unit includes a low pass filter circuit 19 which serves to reduce the level of any unwanted noise signals which may be present, and a band reject filter circuit 21 tuned to the system frequency which serves to extract temporarily the fault components of the phase voltage and phase current signals in known manner.

The extracted fault phase voltage and current signals V and I are each fed to two signal generators 23 and 25 which respectively generate signals V+IZ and V−IZ, where Z is the characteristic impedance of the associated phase of the system at the frequency at which fault transients are likely to occur, i.e. the relevant phase surge impedance. These signals are hereinafter referred to as FW and RW respectively.

Taking the positive direction of the flow of current I to be in the direction along the zone to be protected by the protective relay equipment of which the fault location apparatus forms part, away from the relaying point, the signal FW changes in operation only for transient signals travelling in the positive direction of current flow, i.e. in a direction from A to B in FIGS. 1 and 2. Similarly, the signal RW changes only for transient signals travelling in the reverse direction, i.e. in a direction from B to A in FIGS. 1 and 2.

The signal RW and the signal I are fed to the unit 13 wherein their values are compared. If the signal I and the signal RW both first reach preset levels at the same time, indicating the presence of a fault in the forward direction from the relaying point, i.e. in the direction of the protected zone, the unit produces an output signal utilised as described below.

In the unit 15, the signals FW and RW are fed to respective dead band amplifiers 27 and 29. The amplifiers 27 and 29 are each arranged to produce an output corresponding to its input only when its input is above a threshold level, their outputs otherwise being zero. The threshold levels are chosen to be higher than the input signal level due to mutual coupling from other phases, thereby ensuring that only the fault location unit 15 connected to a faulty phase responds when a fault occurs.

The outputs of the amplifiers 27 and 29 are fed to respective polarity check units 31 and 33. For a positive input signal each of the units 31 and 33 produces an output which follows its input. For a negative input signal each of the units 31 and 33 produces an output which is the inverse of its input.

The outputs of the polarity check units 31 and 33 are fed via respective differentiator units 35 and 37, to respective peak detector circuits 39 and 41, the differentiator units 35 and 37 producing pulses corresponding to the transient signals, as described above with reference to FIG. 3.

The peak detector circuit 39 to which pulses derived from the FW signal are applied is arranged to produce an output signal SFW when an applied FW pulse exceeds a first pre-set level. The signal SFW is supplied to a timing and logic circuit 43. When the level of the applied FW pulse falls below a second pre-set level the peak detector 39 passes a signal to the peak detector 41 to start its operation. The detector 41 supplies a signal SRW to the timing and logic circuit 43 when an applied RW pulse exceeds a pre-set level.

Thus, following the occurrence of a fault, a signal SFW is produced in response to the first transient signal passing the relaying point in the forward direction and a signal SRW is produced in response to the next transient signal passing the relaying point in the reverse direction. As will be appreciated from the description above in relation to FIG. 2, the elapse time between SFW and SRW for a fault in the forward direction corresponds to the time a transient signal takes to travel from the relaying point to the fault point and back to the fault point.

The timing and logic circuit 43 compares the elapse time between SFW and RFW with a preset time corresponding to the time (2T) a transient signal takes to travel from the relaying point to the end of the protected zone and back to the relaying point. If the elapse time is less than the preset time the circuit 43 produces a tripping signal causing the appropriate circuit breakers controlled by the protective equipment to operate.

The signal supplied to the timing and logic circuit 43 from the directional fault detection unit 13 inhibits the production of a tripping signal except for faults in the forward direction.

The timing and logic circuit is also arranged to produce a tripping signal in response to an output signal from a level detector 45 supplied with the output of the RW signal dead band amplifier 29. The detector 45 produces an output only when a relatively high level RW signal appears at the output of the amplifier 29. In this way rapid tripping in response to faults close to the relaying point is obtained.

The circuit 43 may also be arranged to measure the elapse time, thereby to produce an output indicating the distance of the fault from the relaying point.

Where the reflection coefficient is sufficiently high at the relaying point to allow detection by the method described above with reference to FIG. 1, the FW signal generator 23, the associated dead band amplifier 27, polarity check unit 32, and differentiating circuit 35 and the peak detector unit 39 may be discarded, and the peak detector unit 41 arranged to supply signals to the timing and logic circuit 43 indicating the times of occurrence of first and second RW pulses.

Alternatively, the RW signal generator 25, the associated amplifier 29, polarity check unit 33 and differentiating circuit 37 and the peak detector unit 41 may be discarded, and the peak detector unit 39 arranged to supply signals to the timing and logic circuit 43 indicating the occurrence of first and second FW pulses. The RW inputs of the directional fault detection unit 13 and the level detector 45 would, of course, be replaced by the corresponding FW inputs in such an arrangement.

It will be appreciated that in an arrangement in accordance with the invention other means than a band reject filter may be used to extract the required fault signals.

It will be appreciated that in other arrangements in accordance with the invention, instead of utilising signals FW and/or RW derived directly from the signals V and I and impedance Z, corresponding modal signals generated by mathematical processes in a modal signal generator in response to the output of the filter unit 17 may be used. By this means the interdependence of the phase signals due to mutual coupling may be eliminated. The required phase tripping signals are obtained by performing an inverse modal transformation on the modal tripping signals.

It will be appreciated that, in accordance with known practice, an apparatus as shown in FIG. 4 will typically work in conjunction with a second fault location apparatus at the far end of the protected zone.

In certain circumstances, the directional fault detection unit 13 of an apparatus as shown in FIG. 4 may be required to operate differently in order to detect correctly the presence of a fault in the forward direction. Such a circumstance is illustrated in FIG. 5 wherein fault location apparatuses as shown in FIG. 4 are provided at monitoring points A and B at opposite ends of a protected zone of length $l_1$, the forward direction for each apparatus being along the protected zone towards the other apparatus, and the monitoring points being also connected by a further shorter line of length $l_2$.

In such a system, for a fault in the protected zone at a position F at a distance $l_f$ from point B such that the distance $l_f+l_2$ downline from the fault to the relaying point A is shorter than the distance $l_1-l_f$ from the fault upline to the point A via the protected zone, the first signal I will arrive at the point A via the shorter path before the first signal RW reaches the point A via the longer path. With the directional fault detection unit 13 arranged to operate as described above, this situation would be treated as a reverse fault condition at monitoring point A and operation of the apparatus to produce a tripping signal would be inhibited. To overcome this the unit 13 may be arranged to supply a signal to the circuit 43 indicating a fault in the forward direction so long as the signal RW first reaches a preset level within a time after the signal I first reaches a preset level equal to the wave transit time of the protected zone.

We claim:

1. A method of locating the position of a fault occurring in an electric power transmission system with respect to a monitoring point comprising: determining the time taken for a transient component of a fault signal to travel from said monitoring point to the fault and back to said monitoring point after reflection at the fault; and comparing said time taken with the time that a transient signal would take to travel from said monitoring point to the end of a zone of the system to be protected by a protective relay equipment associated with the system and back to the monitoring point, thereby to determine whether the fault lies within said zone.

2. A method according to claim 1 wherein said time taken commences when said transient component is reflected at said monitoring point.

3. A method according to claim 1 wherein said time taken commences when said transient component passes the monitoring point after reflection at a point on the side of the monitoring point remote from the fault.

4. A method according to claim 1 wherein said time taken is measured, thereby to provide an indication of the distance of the fault from said monitoring point.

5. An apparatus for use in locating the position of a fault occurring in an electric power transmission system with respect to a monitoring point comprising: signal generating means for producing an output signal in response to the passage of a transient component of a fault signal away from said monitoring point in a given direction; and comparator means responsive to the time between successive outputs from said signal generating means to determine whether said time is less than the time that a transient signal would take to travel from said monitoring point to the end of a zone of the system to be protected by a protective relay equipment associated with the apparatus and back to the monitoring point, thereby to determine whether the fault lies within said zone.

6. An apparatus according to claim 5 including timing means for measuring said time, thereby to provide an indication of the distance of the fault from said monitoring point.

7. An apparatus according to claim 5 including a directional fault detection unit which inhibits operation of the apparatus except for faults in the direction of said zone from the monitoring unit.

8. An apparatus according to claim 5 wherein the said signal generating means comprises: means for extracting signals representing the fault components (V and I) of the system voltage and current; means for generating from said extracted signals a signal of the form $V\pm IZ$ where Z is the surge impedance of the system; and differentiating means responsive to said signal of the form $V\pm IZ$ to produce a pulse corresponding to said transient component.

9. An apparatus according to claim 5 wherein the said signal generating means comprises: means for extracting signals representing the fault components (V and I) of the system voltage and current; means for generating from said extracted signals a signal of the form $V+IZ$ where Z is the surge impedance of the system; and differentiating means responsive to said signal of the form $V+IZ$ to produce a pulse corresponding to said transient component, the apparatus further including a directional fault detection unit which inhibits operation of the apparatus unless the signal representing I and an appropriate signal of the form $V+IZ$ both reach preset levels at substantially the same time.

10. An apparatus according to claim 5 wherein the said signal generating means comprises: means for extracting signals representing the fault components (V and I) of the system voltage and current; means for generating from said extracted signals a signal of the form $V+IZ$ where Z is the surge impedance of the system; and differentiating means responsive to said signal of the $V+IZ$ to produce a pulse corresponding to said transient component, the apparatus further including a directional fault detection unit which inhibits operation of the apparatus unless the appropriate signal of the form $V+IZ$ first reaches a preset level within a time after the signal representing I first reaches a preset level equal to the wave transit time of a zone.

11. An apparatus according to claim 5 including means responsive to the occurrence of a relatively high level transient signal at the monitoring point to provide a rapid indication of a fault at a position close to the monitoring point.

12. An apparatus for use in locating the position of a fault occurring in an electric power transmission system with respect to a monitoring point comprising: first signal generating means for producing an output signal in response to the passage of a transient component of a fault signal past said monitoring point in a direction towards the fault; second signal generating means for producing an output signal in response to the passage of a transient component of a fault signal past said monitoring point in a direction away from the fault; and comparator means responsive to the time between an output of the first signal generating means and the next occurrence of an output from the second signal generating means to determine whether said time is less than the time that a transient signal would take to travel from said monitoring point to the end of a zone of the system to be protected by a protective relay equipment associated with the apparatus and back to the monitoring point, thereby to determine whether the fault lies within said zone.

13. An apparatus according to claim 12, including timing means for measuring said time, thereby to provide an indication of the distance of the fault from said monitoring point.

14. An apparatus according to claim 12, including a directional fault detection unit which inhibits operation of the apparatus except for faults in the direction of said zone from the monitoring unit.

15. An apparatus according to claim 12, wherein each said signal generating means comprises: means for extracting signals representing the fault components (V and I) of the system voltage and current; means for generating from said extracted signals a signal of the form $V \pm IZ$ where Z is the surge impedance of the system; and differentiating means responsive to said signal of the form $V \pm IZ$ to produce a pulse corresponding to said transient component.

16. An apparatus according to claim 12, wherein each said signal generating means comprises: means for extracting signals representing the fault components (V and I) of the system voltage and current; means for generating from said extracted signals a signal of the form $V+IZ$ where Z is the surge impedance of the system; and differentiating means responsive to said signal of the form $V \pm IZ$ to produce a pulse corresponding to said transient component, the apparatus further including a directional fault detection unit which inhibits operation of the apparatus unless the signal representing I and an appropriate signal of the form $V \pm IZ$ both reach preset levels at substantially the same time.

17. An apparatus according to claim 12, wherein each said signal generating means comprises: means for extracting signals representing the fault components (V and I) of the system voltage and current; means for generating from said extracted signals a signal of the form $V \pm IZ$ where Z is the surge impedance of the system; and differentiating means responsive to said signal of the form $V \pm IZ$ to produce a pulse corresponding to said transient component, the apparatus further including a directional fault detection unit which inhibits operation of the apparatus unless the appropriate signal of the form $V \pm IZ$ first reaches a preset level within a time after the signal representing I first reaches a preset level equal to the wave transit time of said zone.

18. An apparatus according to claim 12, including means responsive to the occurrence of a relatively high level transient signal at the monitoring point to provide a rapid indication of a fault at a position close to the monitoring point.

* * * * *